(12) United States Patent
Adrian (10) Patent No.: US 12,082,363 B2
(45) Date of Patent: Sep. 3, 2024

(54) CABLE MANAGEMENT ARM WITH CABLE ANCHOR POINT

(71) Applicant: Microsoft Technology Licensing, LLC, Redmond, WA (US)

(72) Inventor: Jason David Adrian, Woodinville, WA (US)

(73) Assignee: Microsoft Technology Licensing, LLC, Redmond, WA (US)

(*) Notice: Subject to any disclaimer, the term of this patent is extended or adjusted under 35 U.S.C. 154(b) by 350 days.

(21) Appl. No.: 17/451,816

(22) Filed: Oct. 21, 2021

(65) Prior Publication Data

US 2023/0024453 A1     Jan. 26, 2023

Related U.S. Application Data

(60) Provisional application No. 63/222,359, filed on Jul. 15, 2021.

(51) Int. Cl.
    *H05K 7/14*       (2006.01)
    *F16L 3/015*     (2006.01)

(52) U.S. Cl.
    CPC .......... *H05K 7/1491* (2013.01); *F16L 3/015* (2013.01)

(58) Field of Classification Search
    CPC .............................. H05K 7/1491; F16L 3/015
    USPC ........................................................ 361/826
    See application file for complete search history.

(56) References Cited

U.S. PATENT DOCUMENTS

| | | | | |
|---|---|---|---|---|
| 3,710,199 A | * | 1/1973 | Cignoni, Jr. .......... | H05K 7/1491 174/DIG. 9 |
| 6,021,047 A | * | 2/2000 | Lopez .................. | H05K 7/1489 312/223.2 |
| 6,305,556 B1 | * | 10/2001 | Mayer ...................... | G06F 1/18 361/679.01 |

(Continued)

FOREIGN PATENT DOCUMENTS

EP          3393221 A2     10/2018

OTHER PUBLICATIONS

"Self-Healing, High-Density Data Storage", Retrieved From: https://www.seagate.com/in/en/products/storage/data-storage-systems/corvault/, Retrieved Date: Sep. 15, 2021, 14 Pages.

(Continued)

*Primary Examiner* — Anatoly Vortman
(74) *Attorney, Agent, or Firm* — Alleman Hall & Tuttle LLP (57) ABSTRACT

An electronic equipment rack including a chassis configured to support an electronic device within a moveable drawer. The electronic equipment rack may further include a cable management arm coupled to a front side of the electronic equipment rack by a first hinge. The cable management arm may include a cable management structure and may further include a cable anchor point at which a fixed portion of the cable management structure is held at a fixed distance from a reference point located on the chassis. The cable management arm may be configured to be rotatable around the first hinge between a closed position and an open position in which the moveable drawer is configured to be moved inward and outward relative to the chassis. The electronic equipment rack may further include a communication connector located proximate an end of the cable management structure.

11 Claims, 7 Drawing Sheets

(56) References Cited

U.S. PATENT DOCUMENTS

| | | | | |
|---|---|---|---|---|
| 6,327,139 | B1* | 12/2001 | Champion | H05K 7/1491 |
| | | | | 174/72 A |
| 6,442,030 | B1* | 8/2002 | Mammoser | G06F 1/181 |
| | | | | 248/917 |
| 6,600,665 | B2* | 7/2003 | Lauchner | H05K 7/1491 |
| | | | | 361/825 |
| 6,805,248 | B2* | 10/2004 | Champion | H05K 7/1491 |
| | | | | 361/826 |
| 6,854,605 | B2* | 2/2005 | Wrycraft | H05K 7/1491 |
| | | | | 211/187 |
| 7,026,551 | B2* | 4/2006 | Franz | H05K 7/1448 |
| | | | | 174/72 A |
| 7,092,258 | B2* | 8/2006 | Hardt | H02B 1/36 |
| | | | | 361/826 |
| 7,355,120 | B2* | 4/2008 | Herring | H05K 7/1491 |
| | | | | 174/72 A |
| 7,359,218 | B2* | 4/2008 | McGrew | H05K 7/1491 |
| | | | | 361/826 |
| 9,578,779 | B2* | 2/2017 | Yi | A47B 96/00 |
| 9,736,959 | B2* | 8/2017 | Harvilchuck | F16L 3/26 |
| 11,619,328 | B2* | 4/2023 | Hennrich | E05F 1/1207 |
| | | | | 174/72 A |
| 2003/0026084 | A1* | 2/2003 | Lauchner | H05K 7/1491 |
| | | | | 361/826 |
| 2003/0222034 | A1* | 12/2003 | Champion | H05K 7/1491 |
| | | | | 361/826 |

OTHER PUBLICATIONS

"Ultrastar Data 102 Hybrid Storage Platform", Retrieved From: https://web.archive.org/web/20201218222130/https://www.westerndigital.com/products/data-center-platforms/ultrastar-data102-hybrid-platform, Dec. 18, 2020, 2 Pages.

Adrian, Jason, "Introducing Bryce Canyon: Our Next-Generation Storage Platform", Retrieved From: https://engineering.fb.com/2017/03/08/data-center-engineering/introducing-bryce-canyon-our-next-generation-storage-platform/, Mar. 8, 2017, 9 Pages.

"International Search Report and Written Opinion Issued in PCT Application No. PCT/US22/030985", Mailed Date: Oct. 11, 2022, 10 Pages.

* cited by examiner

SIDE VIEW

CABLE MANAGEMENT ARM WITH CABLE ANCHOR POINT

CROSS REFERENCE TO RELATED APPLICATIONS

This application claims priority to U.S. Provisional Patent Application Ser. No. 63/222,359, filed Jul. 15, 2021, the entirety of which is hereby incorporated herein by reference for all purposes.

BACKGROUND

Multi-device systems often are implemented using racks that hold multiple pieces of electronic equipment. For example, data centers typically include hundreds or more computing devices (servers, storage devices, networking infrastructure, etc.) that are situated in racks that each hold multiple servers or other devices. When implemented in this type of configuration, server computing devices are connected to cables to provide electrical power, connectivity, and other functionality. These cables are typically connected to a server computing device at the back of the device. Cables located at the back of a server computing device are often provided in a cable management arm within which the cables are grouped and held together. When maintenance is performed on the server computing device, the server computing device may be pulled out of the rack. Grouping the cables together in the cable management arm may prevent the cables from becoming tangled, disconnected, or damaged when the server computing device is moved into and out of the rack.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

According to one aspect of the present disclosure, an electronic equipment rack is provided, including a chassis configured to support an electronic device within a moveable drawer. The electronic equipment rack may further include a cable management arm coupled to a front side of the electronic equipment rack by a first hinge. The cable management arm may include a cable management structure configured to hold one or more cables. The cable management arm may further include a cable anchor point at which a fixed portion of the cable management structure is held at a fixed distance from a reference point located on the chassis. The cable management arm may be configured to be rotatable around the first hinge between a closed position and an open position in which the moveable drawer is configured to be moved inward and outward relative to the chassis. The electronic equipment rack may further include a communication connector located proximate an end of the cable management structure, via which the one or more cables are configured to be coupled to the electronic device.

DETAILED DESCRIPTION

The present disclosure is directed to managing cabling in systems that hold multiple pieces of electronic equipment in a rack. Any type of electronic equipment is contemplated by the present discussion, though the examples will focus on rack-mounted computing devices, such as servers deployed in data center equipment racks. In addition, although the examples below are discussed with relation to a data center setting, the electronic equipment rack may alternatively be located in some other setting.

In some data center settings, rack-mounted server computing devices are configured to be serviced from the front rather than from the back. By performing maintenance on server computing devices from the front, a user performing the maintenance can access the server computing devices more easily without having to go into a back aisle (also known as a hot aisle) of the data center. Configuring a server computing device to be front-serviceable may more easily allow for online maintenance in which the server computing device continues operating while maintenance is performed.

In previous front-serviceable configurations used for server computing devices, cables are stored in a service loop located in a side portion of the server rack. The service loop may be affixed to the side portion of the server rack. When performing maintenance on the server computing device, the user may have to detach the service loop from the side portion of the server rack and move the service loop out of the way while the server computing device is pulled out of the server rack. When the user moves the service loop, the service loop may become caught on the server rack, other cables, or other computing devices, which may disconnect the cables or damage the cables or the server computing device.

Figure 1:
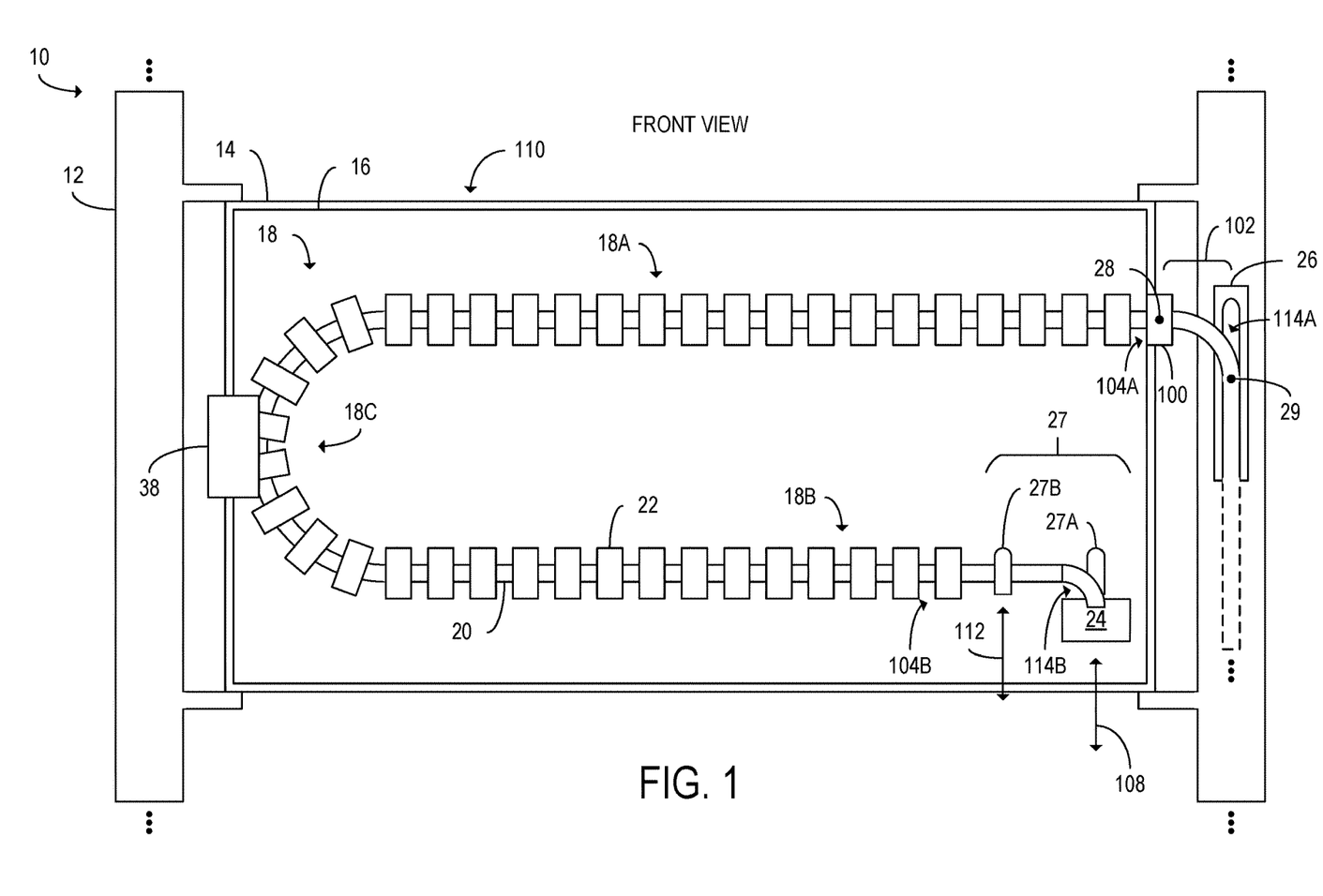
FIG. 1 shows a front view of an example electronic equipment rack including a cable management arm, according to one example embodiment.

To address the above challenges, an electronic equipment rack 10 is provided, an example front view of which is depicted in FIG. 1. In the example of FIG. 1, the electronic equipment rack 10 is a server rack. The electronic equipment rack 10 may include a chassis 12 configured to support a server computing device 16. In other examples, the electronic equipment rack 10 may be configured to support one or more other types of electronic devices. In examples in which the electronic equipment rack 10 is a server rack, the chassis 12 may be configured to support a plurality of vertically stacked server computing devices 16. For each server computing device 16, the chassis 12 may include a moveable drawer 14 within which the server computing device 16 is supported. As discussed in further detail below, the moveable drawer 14 may be configured to move inward and outward relative to the chassis 12 along a front-back axis of the chassis 12 (into and out of the page in the front view of FIG. 1). Accordingly, the user may move the server computing device 16 into a position in which maintenance on the server computing device 16 may be performed.

Each server computing device 16 may be configured to have data processing and/or data storage capabilities. For example, each server computing device 16 may include one or more central processing units (CPUs), graphical processing units (GPUs), application-specific integrated circuits (ASICs), field-programmable gate arrays (FPGAs), and/or other types of processing devices. Additionally or alternatively, the server computing device 16 may include one or more hard disk drives (HDDs), solid-state drives (SSDs), and/or other types of data storage devices.

The electronic equipment rack 10 may further include a cable management arm 18, which may be coupled to a front side of the chassis 12 by a first hinge 26. The cable management arm 18 may include a cable management structure 22 configured to hold one or more cables 20. In the example of FIG. 1, the cable management structure 22 is a cable management chain. In other examples, some other type of cable management structure 22 such as formed spring steel cable management structure may be used. The front side of the chassis 12 may be a front surface of the chassis 12, as shown in the example of FIG. 1. Alternatively, the front side may be a forward portion of the chassis not located on a front surface. For example, the front side may be a forward portion of a side wall of the chassis 12.

The one or more cables 20 may, for example, provide electrical power to the server computing device 16, provide communication between the server computing device 16 and one or more other computing devices, couple the server computing device 16 to a user input or output device, and/or provide one or more other types of functionality to the server computing device 16. Each of the one or more cables 20 may, for example, be an electrical cable or a fiber-optic cable.

The cable management arm 18 may be configured to rotate around the first hinge 26 between a closed position (as shown in FIG. 1) and an open position, as discussed in further detail below. Thus, the first hinge 26 may be configured to rotatably couple a first end 114A of the cable management arm 18 to a front side of the electronic equipment rack 10. In some examples, when the cable management arm 18 is in the closed position, the cable management arm 18 may be held in the closed position by a fastener 38. For example, the fastener 38 may be a latch or a hook-and-loop fastener. The fastener 38 may be configured to fasten the cable management arm 18 to the moveable drawer 14 or the chassis 12.

Figure 2:
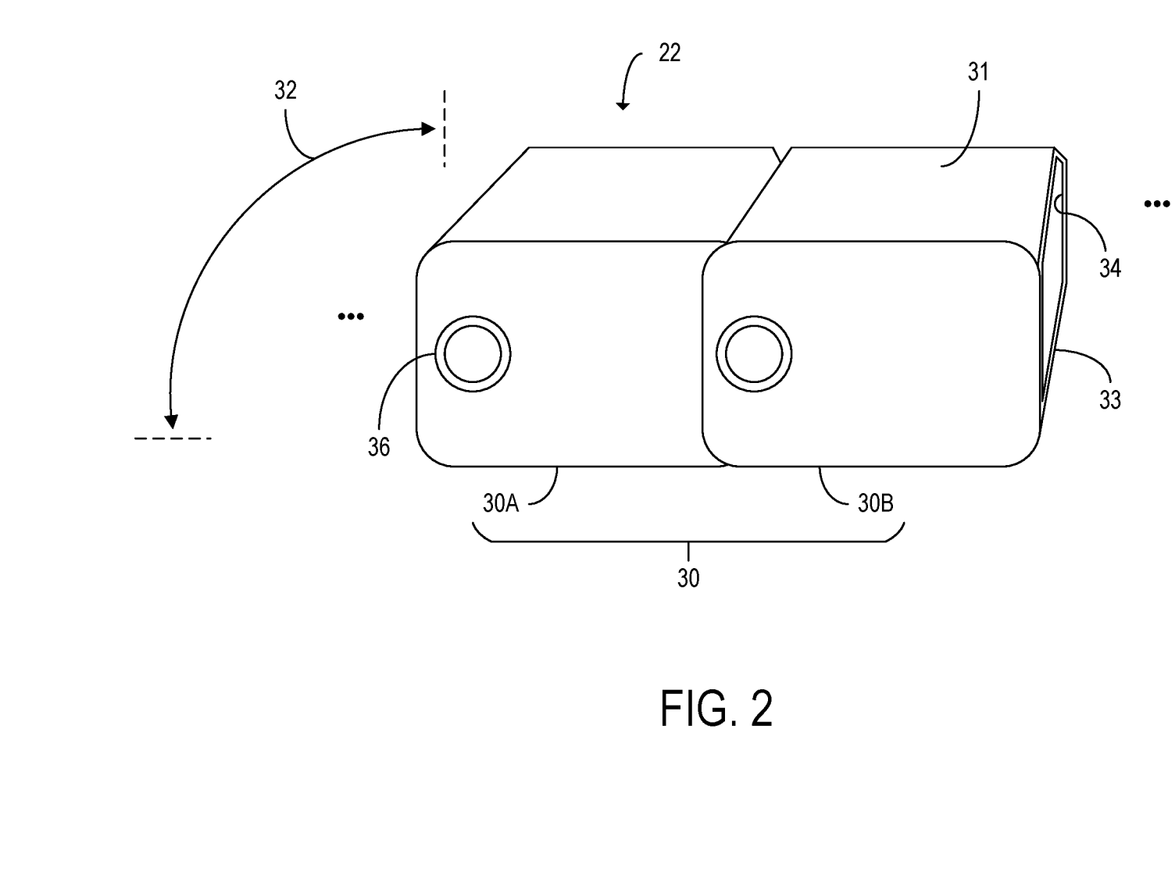
FIG. 2 shows a first link and a second link included in a cable management chain, according to the example of FIG. 1.

As depicted in FIG. 2, the cable management structure 22 may be a cable management chain that includes a plurality of links 30. FIG. 2 shows a first link 30A and a second link 30B of the cable management structure 22 in additional detail, according to one example. In the example of FIG. 2, the first link 30A and the second link 30B are shown in a parallel orientation in which the first link 30A is parallel to the second link 30B. The first link 30A and the second link 30B of the example cable management structure 22 may be coupled by a chain link hinge 36 around which the first link 30A and the second link 30B may be configured to rotate relative to each other. As shown in the example of FIG. 2, the chain link hinge 36 may have a range of motion 32 that is asymmetric relative to the parallel orientation of the first link 30A and the second link 30B. The range of motion 32 of the chain link hinge 36 may, for example, be between 0° (in which the first link 30A is parallel to the second link 30B) and 90° (in which the first link 30A is perpendicular to the second link 30B). Alternatively, the range of motion 32 of the chain link hinge 36 may be some other range of angles. In some examples, the plurality of chain link hinges 36 included in the cable management structure 22 may each have the same range of motion 32. In other examples, the ranges of motion 32 of the chain link hinges 36 between pairs of links 30 included in the cable management structure 22 may be inhomogeneous over the length of the cable management structure 22.

As shown in the example of FIG. 2, the first link 30A and the second link 30B of the cable management structure 22 may each have respective through-holes 34 configured to accommodate the one or more cables 20. In some examples, an upper surface 31 and/or a lower surface 33 of each link may be configured to be removable. Thus, in such examples, the user may more easily perform maintenance on the one or more cables 20 or replace portions of the cable management structure 22 at least in part by removing the upper surface 31 or lower surface 33 of at least one link 30.

In some examples, the cable management structure 22 may be self-supporting due to limits on the ranges of motion 32 of the chain link hinges 36. In such examples, the cable management structure 22 may have a resting position on a front side of the moveable drawer 14, as shown in FIG. 1, without requiring a separate panel for support. The cable management structure 22 may be configured to have a substantially same minimum bend radius as the server computing device 16 moves inward and outward relative to the electronic equipment rack 10. Configuring the cable management structure 22 to be self-supporting may allow components located on the front side of the server computing device 16 to be accessed more easily and may allow for easier repair or replacement of components of the cable management arm 18.

As shown in the example of FIG. 1, The cable management arm 18 may further include a communication connector 24 located proximate an end 104B of the cable management structure 22. For example, the communication connector 24 may be an electrical connector or a fiber-optic connector. Via the communication connector 24, the one or more cables 20 may be coupled to the server computing device 16. The communication connector 24 may include a plug or a port.

The cable management arm 18 may further include a double pivot 27 including a first double pivot hinge 27A and a second double pivot hinge 27B. The first double pivot hinge 27A may be mounted on the moveable drawer 14, as shown in the example of FIG. 1, such that the first double pivot hinge 27A has a fixed location relative to the front side of the server computing device 16. The first double pivot hinge 27A may be located proximate the communication connector 24. The one or more cables 20 may pass through the first double pivot hinge 27A and the second double pivot hinge 27B. As discussed in further detail below, the double pivot 27 may be configured to rotate when the cable management arm 18 rotates between the closed position and the open position. When the cable management arm 18 rotates between the closed position and the open position, the second double pivot hinge 27B may be configured to rotate around a first double pivot hinge axis 108 of the first double pivot hinge 27A.

The cable management arm 18 may further include a cable anchor point 28 located at another end 104A of the cable management structure 22. At the cable anchor point 28, a fixed portion 100 of the cable management structure 22 may be held at a fixed distance 102 from a reference point 29 located on the chassis 12. The fixed portion 100 may, for example, be a link 30 of the cable management structure 22 in examples in which the cable management structure 22 is a cable management chain. Holding the cable anchor point 28 at the fixed distance 102 from the reference point 29 may allow the cable management arm 18 to be moved out of the way of the moveable drawer 14 when the moveable drawer 14 is moved outward from the chassis 12, as discussed in further detail below. The cable anchor point 28 may be located proximate the first hinge 26, as depicted in the example of FIG. 1. In some examples, the reference point 29 may be a location at which the first hinge 26 is configured to hold the cable 20. When the cable management structure 22 has an inward position relative to the chassis 12, the cable management arm 18 may have a U-shape including a substantially flat upper portion 18A, a substantially flat lower portion 18B, and a curved middle portion 18C. The curved middle portion 18C may be located opposite the communication connector 24 and the cable anchor point 28.

As shown in the example of FIG. 1, the one or more cables 20 may pass through the chassis 12. For example, as shown in FIG. 1, the one or more cables 20 may pass through an interior of the chassis 12 in a vertical direction. The reference point 29 may be located on the chassis 12 proximate the first hinge 26. Thus, the fixed portion 100 of the cable management structure 22 located at the cable anchor point 28 may be held at a fixed distance 102 from a location on the chassis 12.

Figure 3:
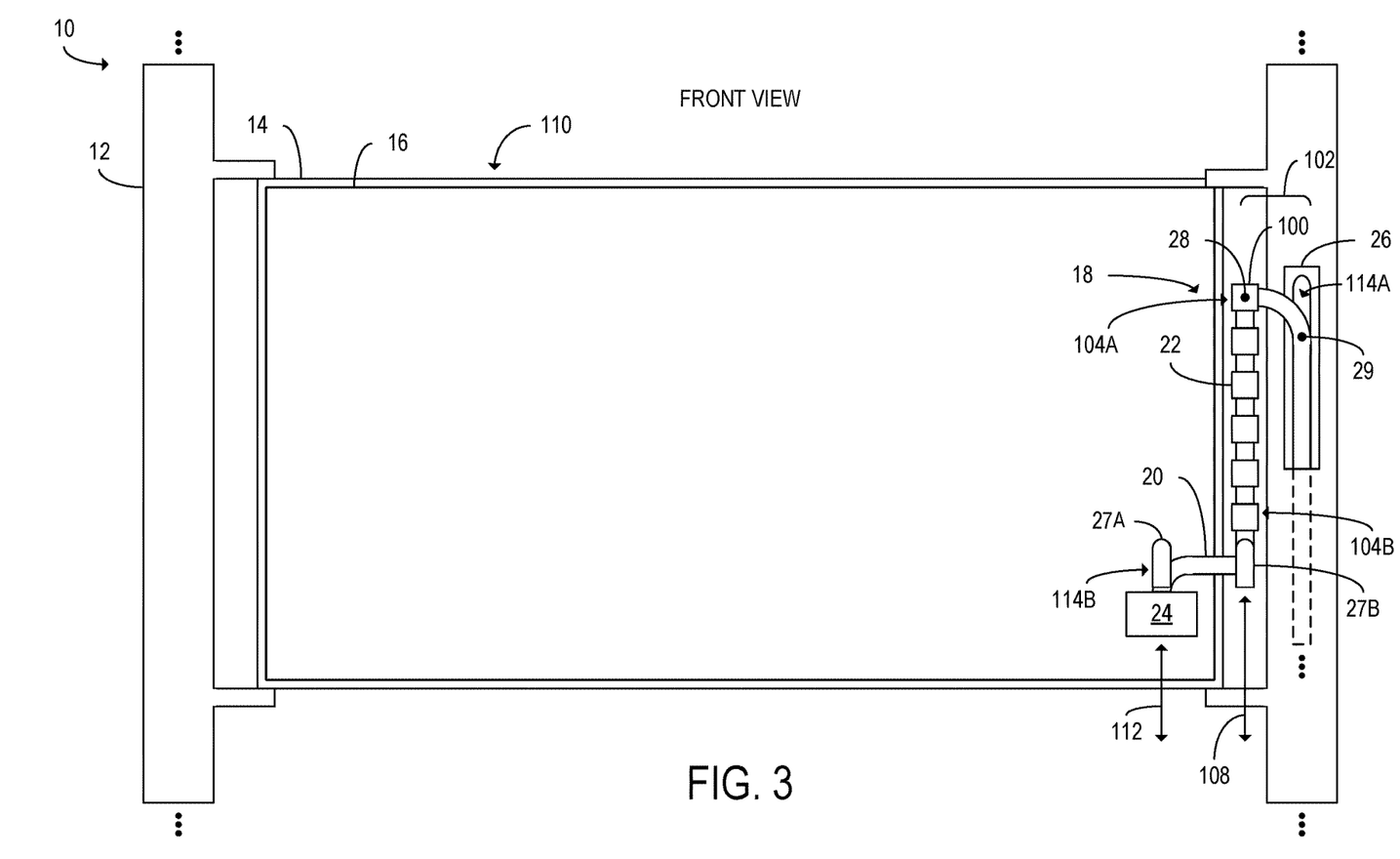
FIG. 3 shows a front view of the electronic equipment rack of FIG. 1 when the cable management arm is in an open position.

FIG. 3 shows a front view of the electronic equipment rack 10 of FIG. 1 when the cable management arm 18 is in the open position. The cable management arm 18 may be parallel to the front-back axis when in the open position. When the cable management arm 18 rotates into the open position, the first double pivot hinge 27A and the second double pivot hinge 27B of the cable management arm 18 may be configured to rotate such that the second double pivot hinge 27B moves toward an outer edge of the electronic equipment rack 10 and out of the way of the moveable drawer 14. A portion of the cable management arm 18 located between the first double pivot hinge 27A and the second double pivot hinge 27B may also be configured to rotate around the axis of the first double pivot hinge 27A when the cable management arm 18 rotates between the closed position and the open position. Thus, when the cable management arm 18 is in the open position, the moveable drawer 14 may be moved inward and outward relative to the chassis 12 along the front-back axis without being obstructed by the cable management structure 22. In some examples, as depicted in FIG. 3, the cable management arm 18 may be arranged in front of a gap between the moveable drawer 14 and a vertical portion of the chassis 12 when in the open position. Alternatively, when the cable management arm 18 is in the open position, the cable management arm 18 may be located in front of the vertical portion of the chassis 12.

Figure 4A:
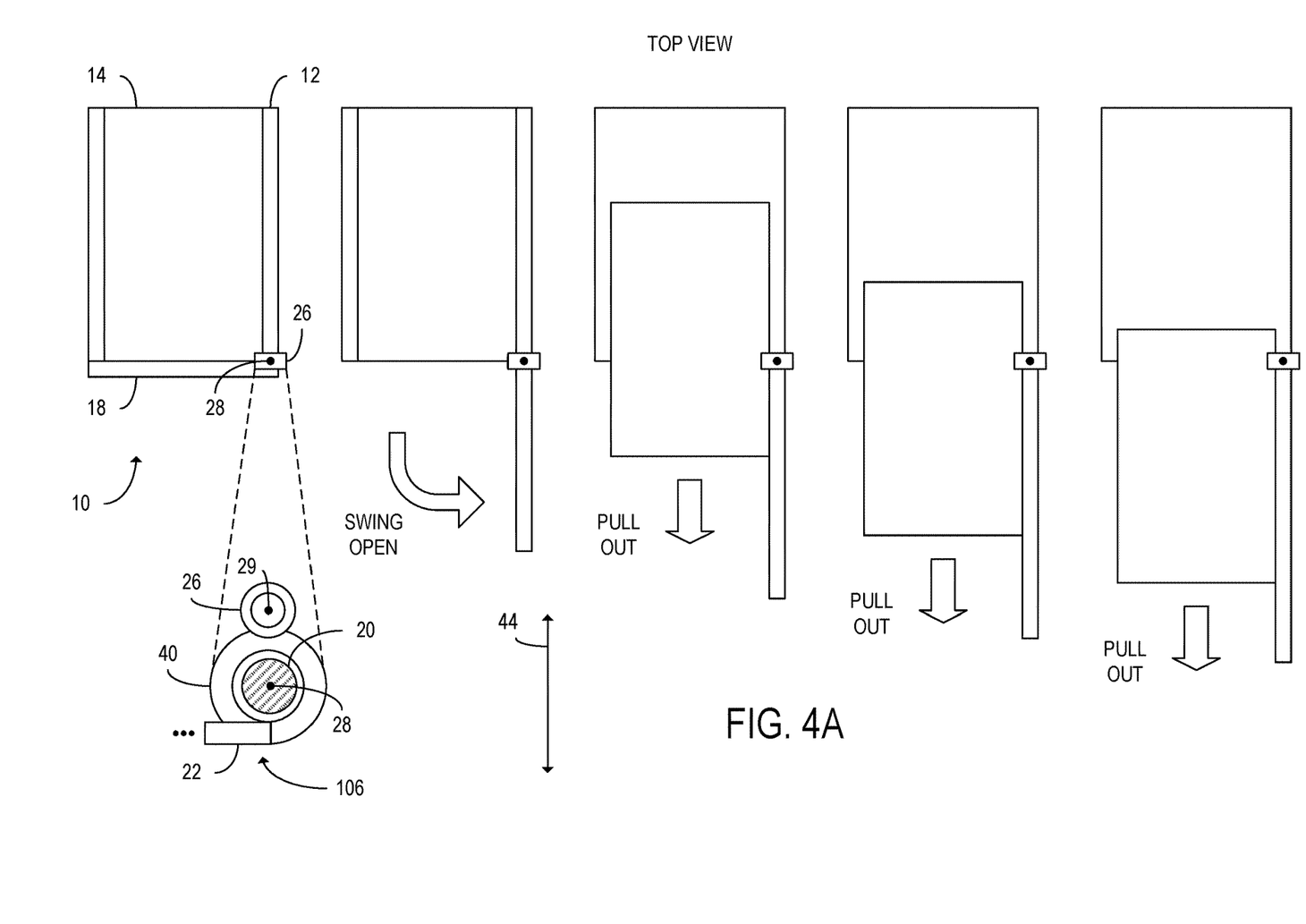
FIG. 4A shows a top view of the example electronic equipment rack of FIG. 1 when the cable management arm is moved into the open position and a moveable drawer is moved along a front-back axis.

FIG. 4A shows a top view of the electronic equipment rack 10 of FIG. 1. In the top view of FIG. 4A, a region of the electronic equipment rack 10 around the cable anchor point 28 is also shown in additional detail. The first hinge 26 may be coupled to a cable guide 40 through which the one or more cables 20 may pass at the cable anchor point 28. As shown in FIG. 4A, the cable guide 40 may be a hollow cylinder, and the one or more cables 20 may be located along a central axis of the cable guide 40. The cable guide 40 may be coupled to the cable management structure 22 on a side 106 of the cable guide 40 opposite the first hinge 26. In addition, the reference point 29 may be located within the first hinge 26 such that when the first hinge 26 rotates, the portion of the cable 20 that passes through the cable guide 40 rotates around the reference point 29 at a fixed distance 102 from the reference point 29.

As shown in FIG. 4A, the cable management arm 18 may be configured to be rotatable around the first hinge 26 from a closed position into an open position. In the closed position, the cable management arm 18 may be parallel to a front surface of the moveable drawer 14. In the example of FIG. 4A, when the cable management arm 18 rotates into the open position, the cable management arm 18 rotates by 90° such that the cable management arm 18 is perpendicular to the front surface of the moveable drawer 14. In addition, when the cable management arm 18 is in the open position, the moveable drawer 14 may be configured to be moveable along the front-back axis 44 of the chassis 12. Thus, a user who is performing maintenance on the server computing device 16 may slide the moveable drawer 14 at least partially out of the chassis 12 in order to access portions of the server computing device 16 that would otherwise be difficult to reach. In some examples, the moveable drawer 14 may be fully removeable from the chassis 12. In other examples, the moveable drawer 14 may be configured to slide out of the chassis 12 up to a fixed distance that is shorter than the entire length of the moveable drawer 14.

Figure 4B:
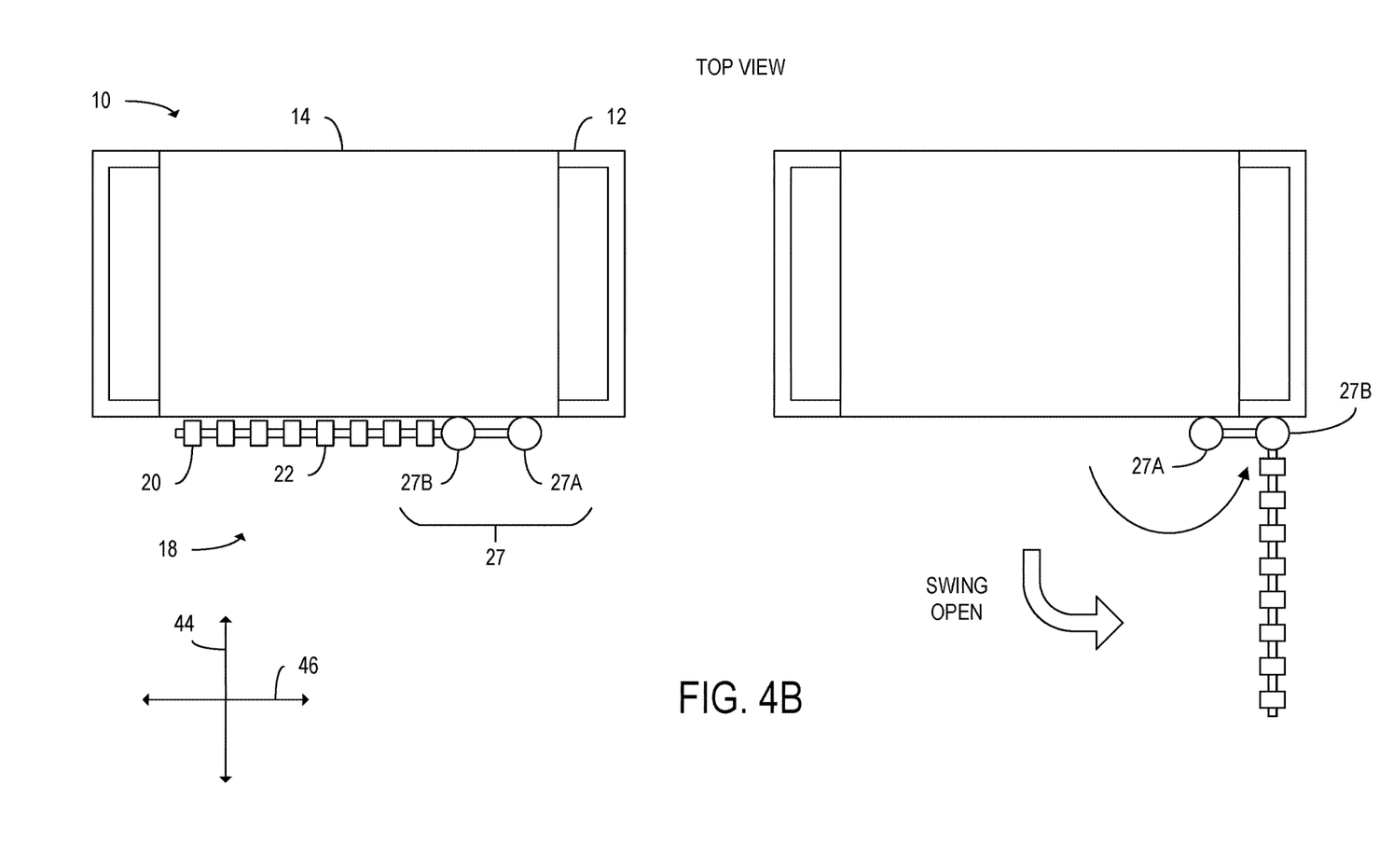
FIG. 4B shows a top view of a double pivot included in the example electronic equipment rack of FIG. 1 when the cable management arm is moved into the open position.

FIG. 4B shows a top view of the double pivot 27 of the cable management arm 18 when the cable management arm 18 is moved from the closed position to the open position. As depicted in the example of FIG. 4B, the second double pivot hinge 27B may move toward an outer edge of the electronic equipment rack 10 when the cable management arm 18 is moved into the open position. When the cable management arm 18 is moved into the open position, the first double pivot hinge 27A may be rotated such that the second double pivot hinge 27B is located between the moveable drawer 14 and the chassis 12 along a horizontal axis 46 perpendicular to the front-back axis 44. Thus, the double pivot 27 may be moved into a position in which it does not obstruct the movement of the moveable drawer 14 along the front-back axis 44.

Figure 5:
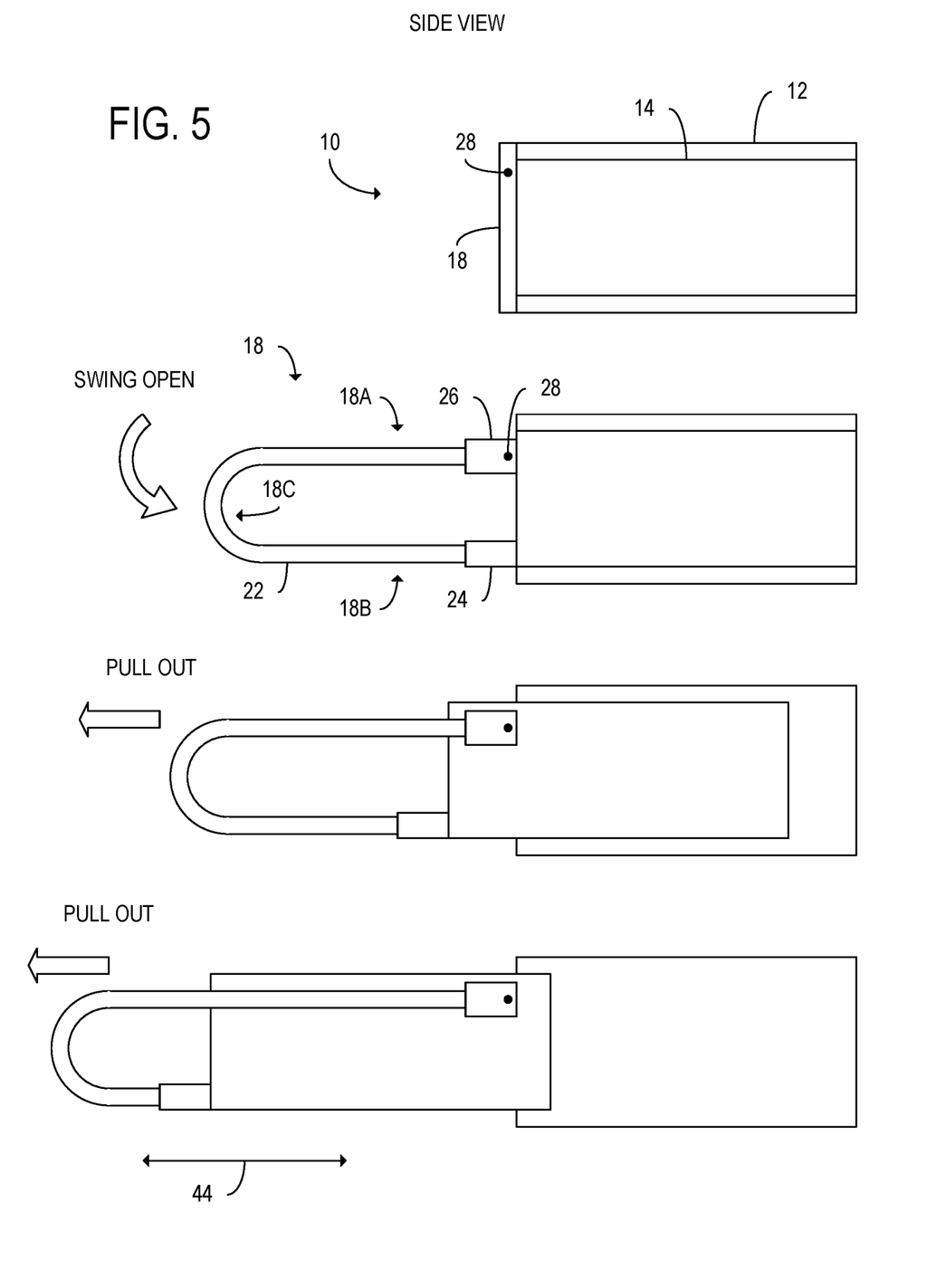
FIG. 5 shows a side view of the example electronic equipment rack of FIG. 1 when the cable management arm is moved into an open position and a moveable drawer is moved along a front-back axis.

When the moveable drawer 14 is moved toward the front side of the electronic equipment rack 10, the communication connector 24 may be configured to move with the moveable drawer 14 while the cable anchor point 28 remains fixed relative to the chassis 12. When the communication connector 24 moves outward relative to the chassis 12, toward the front side of the electronic equipment rack 10, the cable management structure 22 may be configured to change in shape. FIG. 5 shows a side view of the electronic equipment rack 10 when the cable management arm 18 is moved from the closed position to the open position and as the moveable drawer 14 is moved toward the front side of the chassis 12. As depicted in the example of FIG. 5, when the moveable drawer 14 is moved forward, the lower portion 18B of the cable management structure 22 may become shorter and the upper portion 18A of the cable management structure 22 may become longer due to chain link hinges 36 in the lower portion 18B of the cable management structure 22 bending and chain link hinges 36 in the upper portion 18A of the cable management structure 22 straightening. Due to the limited ranges of motion 32 of the chain link hinges 36 between the links 30 included in the cable management structure 22, the cable management structure 22 may remain self-supporting and may retain the U-shape as the moveable drawer 14 is moved inward and outward relative to the chassis 12. The cable management arm 18 may be configured to retain a substantially same carried cable path length from the first hinge 26 to the first double pivot hinge 27A as the server computing device 16 moves inward and outward relative to the electronic equipment rack 10. By retaining substantially the same carried cable path length, the cable management arm 18 may prevent the cable 20 from significantly slackening or tightening in ways that may lead to electronic components becoming damaged when the moveable drawer 14 is moved inward and outward.

Although, in the above examples, the first hinge 26 is located above the communication connector 24, the first hinge 26 may be located below the communication connector 24 in other examples. In such examples, the cable anchor point 28 may be located below the communication connector 24, proximate the first hinge 26. In addition, the double pivot 27 may be located above the first hinge 26 in such examples. In examples in which the first hinge 26 is located below the communication connector 24, the lower portion 18B of the cable management structure 22 may become longer and the upper portion 18A of the cable management structure 22 may become shorter as the moveable drawer 14 is moved toward the front of the chassis 12.

The devices discussed above may allow a technician to perform maintenance on an electronic device (e.g. a server computing device in a data center) more easily and with a decreased risk of damaging device components compared to previous cable management devices. The electronic equipment rack configurations discussed above may allow the user to access components of an electronic device from the front of the electronic equipment rack that would otherwise be difficult to access. For example, servicing such components may otherwise require entering a back aisle of a data center. By moving a cable management arm into an open position, the user may slide a moveable drawer that holds the electronic device out of a chassis of the electronic equipment rack without having to move the cables in a manner that risks damaging the cables or components of the electronic device. In addition, the cable management arm discussed above may be repaired and replaced more easily than a conventional back-mounted cable management arm.

Figure 6:
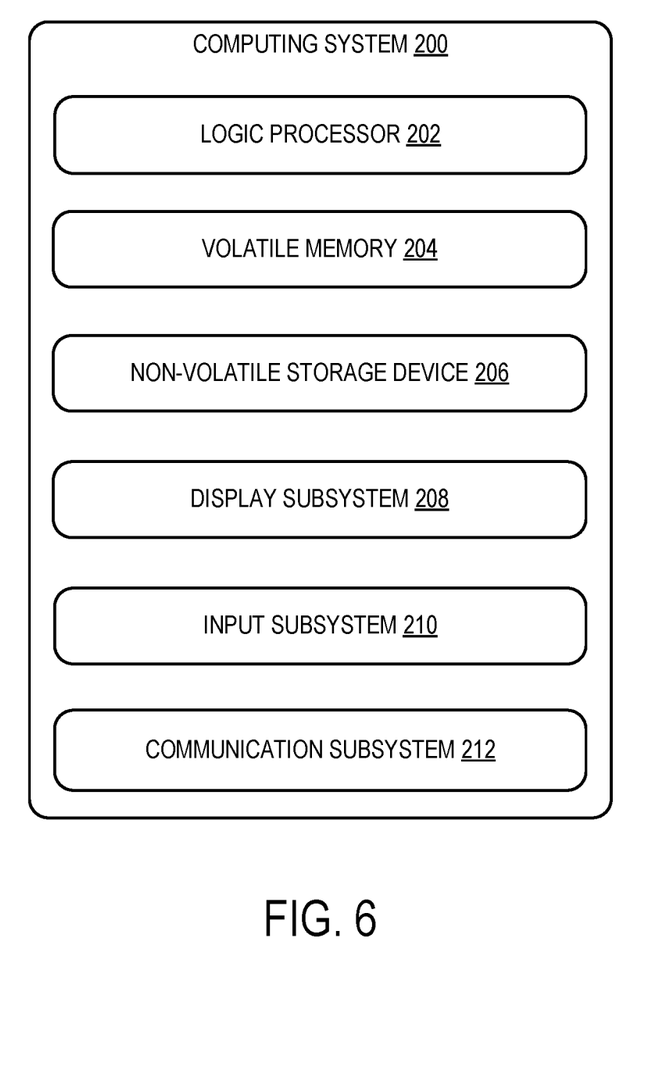
FIG. 6 schematically shows an example computing system in which a server computing device may be instantiated, according to the example of FIG. 1.

FIG. 6 schematically shows a non-limiting embodiment of a computing system 200 in which the server computing device 16 of FIG. 1 may be instantiated. Computing system 200 is shown in simplified form. Computing system 200 may include one or more personal computers, server computers, tablet computers, home-entertainment computers, network computing devices, video game devices, mobile computing devices, mobile communication devices (e.g., smart phone), and/or other computing devices. Computing system 200 includes a logic processor 202 volatile memory 204, and a non-volatile storage device 206. Computing system 200 may optionally include a display subsystem 208, input subsystem 210, communication subsystem 212, and/or other components not shown in FIG. 6.

Logic processor 202 includes one or more physical devices configured to execute instructions. For example, the logic processor may be configured to execute instructions that are part of one or more applications, programs, routines, libraries, objects, components, data structures, or other logical constructs. The logic processor may include one or more physical processors configured to execute software instructions. Additionally or alternatively, the logic processor may include one or more hardware logic circuits or firmware devices configured to execute hardware-implemented logic or firmware instructions. Processors of the logic processor 202 may be single-core or multi-core, and the instructions executed thereon may be configured for sequential, parallel, and/or distributed processing.

Non-volatile storage device 206 includes one or more physical devices configured to hold instructions executable by the logic processors. Non-volatile storage device 206 may include physical devices that are removable and/or built-in. Non-volatile storage device 206 may include optical memory, semiconductor memory, and/or magnetic memory, or other mass storage device technology. Non-volatile storage device 206 may include nonvolatile, dynamic, static, read/write, read-only, sequential-access, location-addressable, file-addressable, and/or content-addressable devices. It will be appreciated that non-volatile storage device 206 is configured to hold instructions even when power is cut to the non-volatile storage device 206.

Volatile memory 204 may include physical devices that include random access memory. Volatile memory 204 is typically utilized by logic processor 202 to temporarily store information during processing of software instructions. It will be appreciated that volatile memory 204 typically does not continue to store instructions when power is cut to the volatile memory 204.

Aspects of logic processor 202, volatile memory 204, and non-volatile storage device 206 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 208 may be used to present a visual representation of data held by non-volatile storage device 206. The visual representation may take the form of a graphical user interface (GUI). Such display devices may be combined with logic processor 202, volatile memory 204, and/or non-volatile storage device 206 in a shared enclosure, or such display devices may be peripheral display devices.

When included, input subsystem 210 may comprise or interface with one or more user-input devices such as a keyboard, mouse, touch screen, or game controller. In some embodiments, the input subsystem may comprise or interface with selected natural user input (NUI) componentry.

When included, communication subsystem 212 may be configured to communicatively couple various computing devices described herein with each other, and with other devices. Communication subsystem 212 may include wired and/or wireless communication devices compatible with one or more different communication protocols. In some embodiments, the communication subsystem may allow computing system 200 to send and/or receive messages to and/or from other devices via a network such as the Internet.

The following paragraphs discuss several aspects of the present disclosure. According to one aspect of the present disclosure, an electronic equipment rack is provided, including a chassis configured to support an electronic device within a moveable drawer. The electronic equipment rack may further include a cable management arm coupled to a front side of the electronic equipment rack by a first hinge. The cable management arm may include a cable management structure configured to hold one or more cables. The cable management arm may further include a cable anchor point at which a fixed portion of the cable management structure is held at a fixed distance from a reference point located on the chassis. The cable management arm may be configured to be rotatable around the first hinge between a closed position and an open position in which the moveable drawer is configured to be moved inward and outward relative to the chassis. The electronic equipment rack may further include a communication connector located proximate an end of the cable management structure, via which the one or more cables are configured to be coupled to the electronic device.

According to this aspect, the reference point may be located proximate the first hinge.

According to this aspect, the electronic equipment rack may further include a cable guide within which the one or more cables are configured to be coupled to the cable management structure at the cable anchor point on a side of the cable guide opposite the first hinge.

According to this aspect, the first hinge may be mounted on the chassis.

According to this aspect, the cable management arm may further include a double pivot including a first double pivot hinge and a second double pivot hinge. The first double pivot hinge may be mounted on the moveable drawer. The second double pivot hinge may be configured to rotate around a first double pivot hinge axis of the first double pivot hinge when the cable management arm rotates between the closed position and the open position.

According to this aspect, when the cable management arm is in the open position, the second double pivot hinge may be located between the moveable drawer and the chassis along a horizontal axis perpendicular to a front-back axis of the chassis.

According to this aspect, the cable management structure may be a cable management chain that includes a plurality of links coupled by a respective plurality of chain link hinges. The plurality of links may have a respective plurality of through-holes configured to accommodate the one or more cables.

According to this aspect, each chain link hinge of the plurality of chain link hinges may have a respective range of motion that is asymmetric relative to a parallel orientation of the links coupled by the chain link hinge.

According to this aspect, in the open position, the cable management arm may be parallel to a front-back axis of the chassis.

According to this aspect, in the closed position, the cable management arm may be perpendicular to the front-back axis.

According to this aspect, when the cable management structure has an inward position relative to the chassis, the cable management structure may have a U-shape including a substantially flat upper portion, a substantially flat lower portion, and a curved middle portion located opposite the communication connector and the cable anchor point.

According to this aspect, the electronic equipment rack may be a server rack and the electronic device may be a server computing device.

According to another aspect of the present disclosure, a cable management arm operable to be coupled to an electronic equipment rack is provided. The cable management arm may include a first hinge located at a first end 114A of the cable management arm. The cable management arm may further include a second hinge located at a second end 114B of the cable management arm opposite the first end. The cable management arm may further include a third hinge located proximate to the second end of the cable management arm and at a fixed distance from the second hinge. The cable management arm may further include a cable management structure operable to carry one or more cables. The cable management structure may have a first end and a second end located opposite the first end. The first end of the cable management structure may be located at a fixed distance to the first hinge. The first hinge may be configured to rotatably couple the first end of the cable management arm to a front side of the electronic equipment rack. The cable management arm may be configured to rotate between a closed position substantially parallel to the front side of the electronic equipment rack and an open position substantially perpendicular to the front side of the electronic equipment rack.

According to this aspect, the second hinge may have a fixed location relative to a front side of an electronic device supported by the electronic equipment rack.

According to this aspect, the cable management arm may be configured to retain a substantially same carried cable path length from the first hinge to the second hinge as the electronic device moves inward and outward relative to the electronic equipment rack.

According to this aspect, a portion of the cable management arm located between the second hinge and the third hinge may be configured to rotate around a second-hinge axis 112 of the second hinge when the cable management arm rotates between the closed position and the open position.

According to this aspect, the cable management structure may be a cable management chain that includes a plurality of links coupled by a respective plurality of chain link hinges. The plurality of links may have a respective plurality of through-holes configured to accommodate the one or more cables.

According to this aspect, each chain link hinge of the plurality of chain link hinges may have a respective range of motion that is asymmetric relative to a parallel orientation of the links coupled by the chain link hinge.

According to another aspect of the present disclosure, an electronic equipment rack is provided, including a chassis configured to support an electronic device within a moveable drawer. The electronic equipment rack may further include a cable management arm coupled to a front side of the electronic equipment rack by a first hinge mounted on the chassis. The cable management arm may include a cable management structure configured to hold one or more cables. The cable management arm may further include a cable anchor point at which a fixed portion of the cable management structure is held at a fixed distance from a reference point located on the chassis. The cable management arm may further include a double pivot including a first double pivot hinge and a second double pivot hinge. The first hinge may be located proximate a first end of the cable management structure. The first double pivot hinge may be mounted on the moveable drawer and located proximate a second end of the cable management structure opposite the first end. The cable management arm may be configured to be rotatable around the first hinge between a closed position and an open position in which the moveable drawer is configured to be moved inward and outward relative to the chassis. The double pivot may be configured to rotate around a hinge axis of the first double pivot hinge when the cable management arm rotates between the closed position and the open position. The electronic equipment rack may further include a communication connector located proximate the second end of the cable management structure, via which the one or more cables are configured to be coupled to the electronic device.

"And/or" as used herein is defined as the inclusive or v, as specified by the following truth table:

| A | B | A ∨ B |
|---|---|---|
| True | True | True |
| True | False | True |
| False | True | True |
| False | False | False |

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An electronic equipment rack comprising:
a chassis supporting an electronic device within a moveable drawer; and
a cable management arm coupled to a front side of the electronic equipment rack by a first hinge mounted on the chassis, wherein the cable management arm includes:
a cable management structure holding one or more cables; and
a cable anchor point at which a fixed portion of the cable management structure is held at a fixed distance from a reference point located on the chassis, wherein:
the cable management arm is configured to be rotatable around the first hinge between a closed position and an open position in which the moveable drawer is configured to be moved inward and outward relative to the chassis; and
a communication connector located proximate an end of the cable management structure, via which the one or more cables are coupled to the electronic device; and
a double pivot including a first double pivot hinge and a second double pivot hinge, wherein:
the first double pivot hinge is mounted on the moveable drawer; and
the second double pivot hinge is configured to rotate around a first double pivot hinge axis of the first double pivot hinge when the cable management arm rotates between the closed position and the open position.

2. The electronic equipment rack of claim 1, wherein the reference point is located proximate the first hinge.

3. The electronic equipment rack of claim 2, further comprising a cable guide within which the one or more cables are coupled to the cable management structure at the cable anchor point on a side of the cable guide opposite the first hinge.

4. The electronic equipment rack of claim 1, wherein, when the cable management arm is in the open position, the second double pivot hinge is located between the moveable drawer and the chassis along a horizontal axis perpendicular to a front-back axis of the chassis.

5. The electronic equipment rack of claim 1, wherein:
the cable management structure is a cable management chain that includes a plurality of links coupled by a respective plurality of chain link hinges; and
the plurality of links have a respective plurality of through-holes accommodating the one or more cables.

6. The electronic equipment rack of claim 5, wherein each chain link hinge of the plurality of chain link hinges has a respective range of motion that is asymmetric relative to a parallel orientation of the links coupled by the chain link hinge.

7. The electronic equipment rack of claim 1, wherein, in the open position, the cable management arm is parallel to a front-back axis of the chassis.

8. The electronic equipment rack of claim 7, wherein, in the closed position, the cable management arm is perpendicular to the front-back axis of the chassis.

9. The electronic equipment rack of claim 1, wherein, when the cable management structure has an inward position relative to the chassis, the cable management structure has a U-shape including:
a substantially flat upper portion;
a substantially flat lower portion; and
a curved middle portion located opposite the communication connector and the cable anchor point.

10. The electronic equipment rack of claim 1, wherein the electronic equipment rack is a server rack and the electronic device is a server computing device.

11. An electronic equipment rack comprising:
a chassis supporting an electronic device within a moveable drawer; and
a cable management arm coupled to a front side of the electronic equipment rack by a first hinge mounted on the chassis, wherein the cable management arm includes:
a cable management structure holding one or more cables; and
a cable anchor point at which a fixed portion of the cable management structure is held at a fixed distance from a reference point located on the chassis; and
a double pivot including a first double pivot hinge and a second double pivot hinge,
wherein:
the first hinge is located proximate a first end of the cable management structure;
the first double pivot hinge is mounted on the moveable drawer and located proximate a second end of the cable management structure opposite the first end;
the cable management arm is configured to be rotatable around the first hinge between a closed position and an open position in which the moveable drawer is configured to be moved inward and outward relative to the chassis; and
the double pivot is configured to rotate around a hinge axis of the first double pivot hinge when the cable management arm rotates between the closed position and the open position; and
a communication connector located proximate the second end of the cable management structure, via which the one or more cables are coupled to the electronic device.

* * * * *